United States Patent [19]
Wu

[11] Patent Number: 5,585,295
[45] Date of Patent: Dec. 17, 1996

[54] METHOD FOR FORMING INVERSE-T GATE LIGHTLY-DOPED DRAIN (ITLDD) DEVICE

[75] Inventor: Shye-Lin Wu, Hsinchu, Taiwan

[73] Assignee: Vanguard International Semiconductor Corporation, Hsinchu, Taiwan

[21] Appl. No.: 624,946

[22] Filed: Mar. 29, 1996

[51] Int. Cl.⁶ .................................................. H01L 21/266
[52] U.S. Cl. ............................ 437/44; 437/29; 437/200; 148/DIG. 1
[58] Field of Search ................................ 437/29, 30, 44, 437/101, 978; 148/DIG. 1

[56] References Cited

U.S. PATENT DOCUMENTS

| | | | |
|---|---|---|---|
| 4,963,504 | 10/1990 | Huang | 437/44 |
| 5,061,647 | 10/1991 | Roth et al. | 437/44 |
| 5,175,119 | 12/1992 | Matsutani | 437/44 |
| 5,304,504 | 4/1994 | Wei et al. | 437/29 |

*Primary Examiner*—Chandra Chaudhari
*Attorney, Agent, or Firm*—Christensen O'Connor Johnson & Kindness PLLC

[57] ABSTRACT

A method for forming an inverse-T gate lightly-doped drain (ITLDD) structure for deep sub-micron metal oxide semiconductor (MOS) transistors is disclosed. The present invention includes forming a gate oxide layer on a substrate, and forming stacked-amorphous-silicon layers on the gate oxide layer, where the stacked-amorphous-silicon layers comprise at least two layers. Next, a first dielectric layer is patterned on top of the stacked-amorphous-silicon layer by a photoresist mask, and then a lightly-doped source/drain regions is formed. Thereafter, all of the stacked-amorphous-silicon layers are removed except for the bottom amorphous polysilicon layer. A second dielectric spacer is formed on the sidewalls of the stacked-amorphous-silicon layers and heavily-doped source/drain regions are formed. The bottom layer of the stacked-amorphous-silicon layers is and the gate oxide layer is removed using the spacer as an etch mask. The first dielectric layer and the second dielectric spacer is removed and a third dielectric spacer is formed on the sidewalls of the stacked-amorphous-silicon layers and the gate oxide layer. Finally, a silicide is formed on top of the stacked-amorphous-silicon layers and on portions of the heavily-doped source/drain regions.

16 Claims, 3 Drawing Sheets

METHOD FOR FORMING INVERSE-T GATE LIGHTLY-DOPED DRAIN (ITLDD) DEVICE

FIELD OF THE INVENTION

The present invention relates to a method for forming lightly-doped drain (LDD) metal oxide semiconductor (MOS) transistors, and more particularly to a method For Forming inverse-T gate lightly-doped drain (ITLDD) MOS transistors.

BACKGROUND OF THE INVENTION

As the size of devices in semiconductor chips is reduced without a corresponding reduction in voltage, channel hot carrier effect becomes one of the most significant limitations For deep sub-micron metal oxide semiconductor (MOS) transistors. This effect is caused by a high electric field near the drain junction resulting From the short channel length and the high supply voltage. This effect is more serious For an n-channel MOS transistor than For a p-channel MOS transistor because the impact ionization rate of an electron is higher than that of a hole, i.e., more electron-hole pairs are generated by an electron than by a hole. Further, electrons gain sufficient energy and become "hot" under the high electric field. Those hot electrons can inject into the gate oxide, resulting in a gate current. They can also cause impact ionization near the drain and generate a current into the substrate.

To mitigate the channel hot carrier effect, the lightly-doped drain (LDD) structure has been proposed. In the LDD structure, a lightly-doped buffer zone between an n$^+$ heavily-doped drain and the gate is used to dilute the high electric field near the drain junction. The LDD structure is typically formed by implanting a low energy (40 KeV) phosphorous dopant at a dose of $5\sim30\times10^{12}$ ions/cm$^2$ to form an n$^-$ region after the polysilicon gate is Formed. Then, an oxide is chemical vapor deposited and thereafter etched to form spacers on the sidewalls of the gate. The spacers then serve as a mask for a heavy arsenic implant to form n$^+$ regions.

Unfortunately, the location of the peak electric field in a LDD structure may shift so that negative charges are generated in the oxide above the n$^-$ region, resulting in increased series resistance in n$^-$ region. Thus, a small drain-to-gate overlap should be provided to ensure the location of the peak electric field stays underneath the gate electrode.

Another technique to overcome the series resistance problem, known as self-aligned silicide (salicide) technology, has been proposed. This process combines the best features of a polysilicon gate with self-alignment. In salicide technology, a gate sidewall oxide is formed which protects the gate sidewall form shorting to the source/drain regions after silicidation. The gate sidewall oxide is formed either by depositing and anisotropically etching a chemical vapor deposited oxide layer or by selective oxidation of sidewalls of the gate on which there is a silicon nitride layer. See p. 222, of C. M. Osburn et al., "High Conductivity Diffusions and Gate Regions Using Self-Aligned Silicide Technology," *Electrochemical Society Proceedings*, First International Symposium VLSI Science and Technology, Vol. 82–7, 1982.

During the silicidation process, some by-product impurities such as the F atom in forming tungsten silicide, will diffuse into the gate oxide, resulting in a thicker gate oxide. The thicker the gate oxide, the slower the device and the higher threshold voltage. See pp. 623–625, of S. L. Hsu et al., "Direct evidence of gate oxide thickness increase in tungsten polycide processes," *IEEE Electron Device Letter*, Vol. EDL-12, 1991. Moreover, the resistance between poly gate and silicide is large owing to the rough surface of the polysilicon. See pp. 176–179, of H. Yen, "Thermal treatment and under layer effects on silane and dichlorosilane based tungsten silicide for deep submicron interconnection processes," *VLSI Technology, system, and, Applications*, 1995. An improved poly gate using stacked-amorphous-silicon has been proposed. The stacked-amorphous-silicon is used in this technology to provide a smoother gate surface to reduce the resistance mentioned above, and provide a structure that is harder for the F atom to penetrate into gate oxide. See pp. 1797–1803, of S. L. Wu et al., "Characteristics of polysilicon contacted shallow junction diode formed with a stacked-amorphous-silicon film," *IEEE Electron Devices*, vol. ED-40, 1993.

SUMMARY OF THE INVENTION

A method for forming an inverse-T gate lightly-doped drain (ITLDD) device is disclosed. The method comprises forming a gate oxide layer on a substrate, forming stacked-amorphous-silicon layers on the gate oxide layer, said stacked-amorphous-silicon layers comprising at least two layers, patterning a first dielectric layer on top of the stacked-amorphous-silicon layers by a photoresist mask, forming lightly-doped source/drain regions using said photoresist mask, removing portions of the stacked-amorphous-silicon layers until the bottom layer of said stacked-amorphous-silicon layers is exposed using said photoresist mask, forming a second dielectric spacer on the sidewalls of the stacked-amorphous-silicon layers, forming heavily-doped source/drain regions, said first dielectric layer and said second dielectric spacer serve as an implant mask, removing the bottom layer of said stacked-amorphous-silicon layers, and the gate oxide layer using said implant mask, removing the first dielectric layer and the second dielectric spacer, forming a third dielectric spacer on the sidewalls of the stacked-amorphous-silicon layers and the gate oxide layer, and forming a silicide on top of the stacked-amorphous-silicon layers and on portions of the heavily-doped source/drain regions.

BRIEF DESCRIPTION OF THE DRAWINGS

FIG. 1 shows the structure after a gate oxide, stacked-amorphous-silicon layers and a silicon nitride layer are formed on a substrate;

FIG. 2 shows the structure after the silicon nitride layer is patterned to define a gate region;

FIG. 3 shows the implantation of a light dose of ions to form n$^-$ lightly-doped source/drain regions;

FIG. 4 shows the structure after two upper layers of the stacked-amorphous-silicon are etched using a native oxide thin film as an etching stop;

FIG. 5 shows the structure after silicon nitride spacers are formed;

FIG. 6 shows the implantation of a heavy dose of ions to form n$^+$ heavily-doped source/drain regions;

FIG. 7 shows the structure resulting from the etching of the spacers, the bottom layer of the stacked-amorphous-silicon, and the gate oxide:

FIG. 8 shows the structure after another pair of silicon nitride spacers are formed; and FIG. 9 shows the ITLDD structure with salicide formed over the gate and the source/drain regions.

DESCRIPTION OF THE PREFERRED EMBODIMENT

Figure 1:
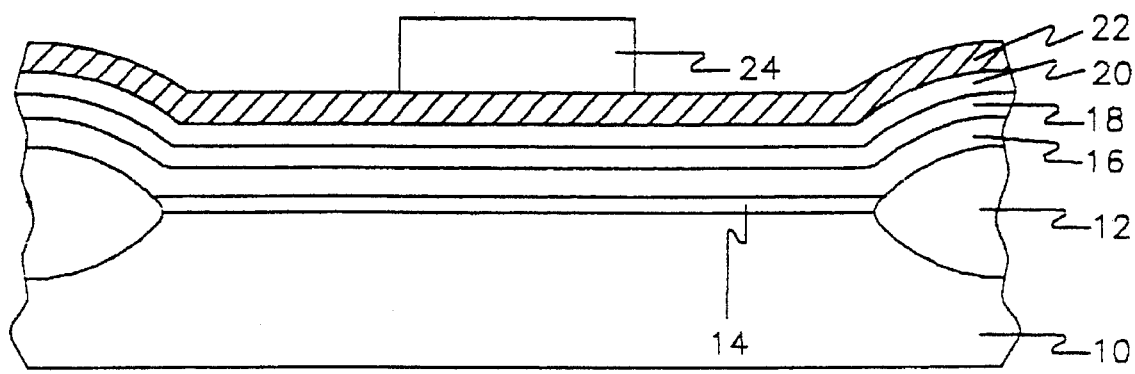
FIG. 1 to 9 are cross-sectional views of a structure formed at various stages in the fabrication of a ITLDD transistor in accordance with the invention.

FIG. 1 shows a schematic cross-section of a silicon substrate 10 with isolation regions 12. These isolation regions 12 are commonly formed using thick oxides having a thickness of about 3000~10000 angstroms and are typically called field oxides. On top of the substrate 10 is a thin layer of silicon dioxide 14, which will be used later on as gate oxide to isolate the gate conductor and the semiconductor substrate 10. This thin oxide layer 14 is grown by using a conventional thermal oxidation process and has a thickness of about 100~300 angstroms. Next, stacked-amorphous-silicon layers 16, 18 and 20 are deposited by the chemical vapor deposition (CVD) method at low pressure (0.2~1.0 torr) by the decomposition of silane ($SiH_4$) at 500°~575° C. As the stacked-amorphous-silicon layers 16, 18 and 20 are formed sequentially, on top of every amorphous polysilicon layer is a thin native oxide film, a by-product resulting from the chemical vapor deposition process used. The thickness range of the stacked-amorphous-silicon layers 16, 18 and 20 total is about 3000~7000 angstroms. On top of the amorphous polysilicon layer 20 is a layer of silicon nitride 22, which is deposited using conventional low pressure chemical vapor deposition (LPCVD) or plasma-enhanced chemical vapor deposition (PECVD). After that, a photoresist masking layer 24 having a gate pattern is formed over the silicon nitride layer 22. This pattern is defined using standard photoresist coating, exposure and development processes.

Figure 2:
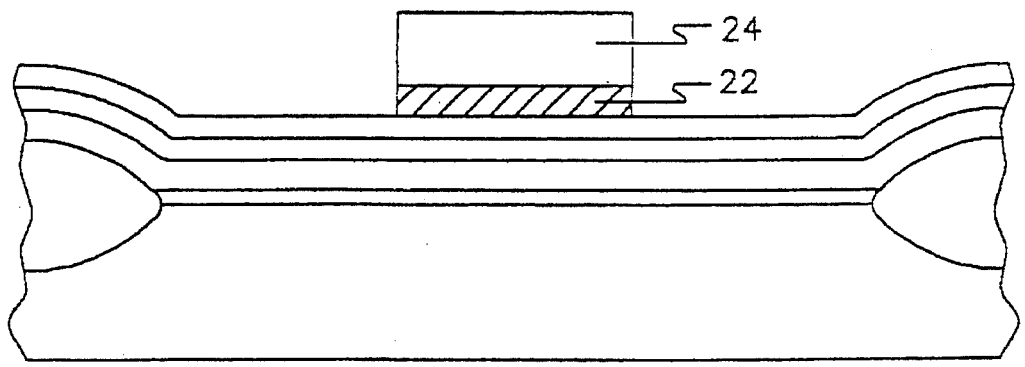

FIG. 2 shows the resulting structure after etching the silicon nitride layer 22 by using the photoresist pattern 24 as a mask. This etch process is typically done at 180° C. with a boiling phosphoric acid solution. This patterned silicon nitride layer 22 defines the gate region and serves as an implant mask layer during a subsequent heavy implant step.

Figure 3:
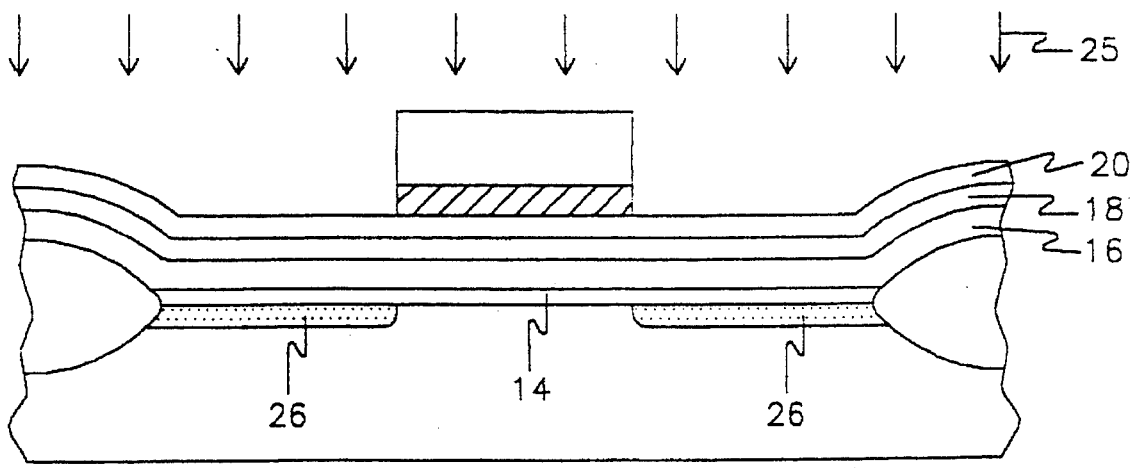

Referring to FIG. 3, $n^-$ lightly-doped regions 26 are formed under the gate oxide 14 by using a conventional ion implant 25 method. Preferably, a phosphorus dopant having a dose of $1 \times 10^3$ ions/$cm^2$ and implant energy of 60 kilo electron volts (KeV) is used.

Figure 4:
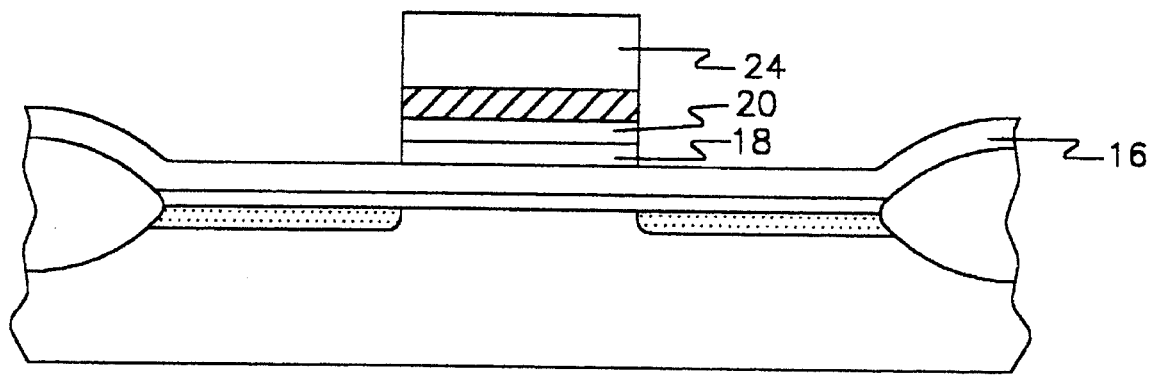

As illustrated in FIG. 4, two upper amorphous polysilicon layers 20 and 18 are etched using the photoresist layer 24 as a mask. The native thin oxide film mentioned above between layer 18 and layer 16 is used here as an etching stop layer. Typically, a plasma etch process with etching of $SF_6/O_2$ is used. An etch rate of about 400~680 nm/min with a 20:1 selectivity over silicon dioxide can be achieved.

Figure 5:
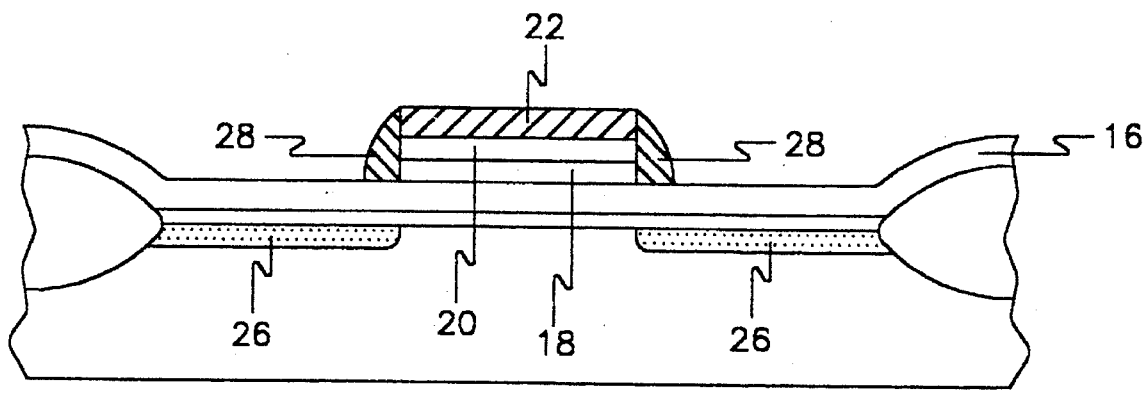

Thereafter, photoresist mask 24 is removed, and another silicon nitride layer 28 is chemically vapor deposited over the amorphous polysilicon layer 16. Next, an anisotropic etch, preferably a reactive ion etch process is used to etch back the silicon nitride layer 26 so as to form spacers 28 on the sidewalls of the silicon nitride layer 22 and two amorphous polysilicon layers 20, 18 as shown in FIG. 5. The length at the bottom of the spacers 28 is in the range of 0.25~0.30 micrometer.

Figure 6:
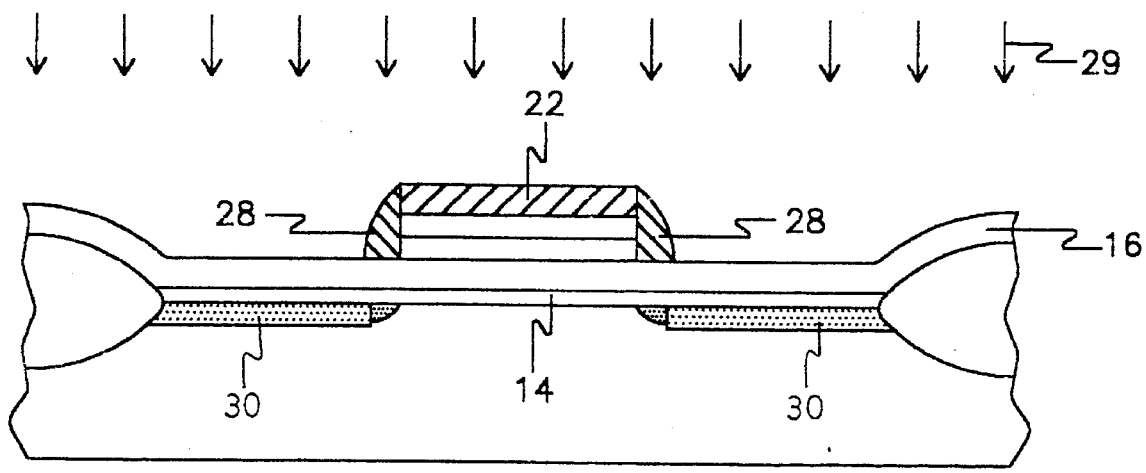

Next, as shown in FIG. 6, an ion implant 29 is performed to form $n^+$ heavily-doped source/drain regions 30, which can be made, for example, using an arsenic dopant with dose of $6 \times 10^{15}$ ions/$cm^2$ and implant energy of 60 KeV. Afterward, the resultant structure is subject to an anneal (or drive-in) step, which will make a redistribution of the dopant deeper into the substrate 10. The anneal is also required to activate the dopant, which initially does not rest on crystal lattice site and hence is not electrically active. Further, the anneal is used to remove crystal damage, which results form the collision of the implanted ions with host atoms within the substrate 10. The anneal is performed, for example, using a furnace at about 1000° C. The anneal can alternatively be achieved by rapid thermal processing (RTP). During RTP, the wafer is rapidly heated from a low temperature to a high temperature of about 1100° C. The wafer is held at this temperature for a short time and then brought back rapidly to a low temperature at rate of about 100°~300° C./s. The processing time for a RTP is typically less than thirty minutes compared to about 120 minutes for furnace processing. Therefore, the thermal budget, which is defined as the product of temperature and time, can be largely reduced.

Figure 7:
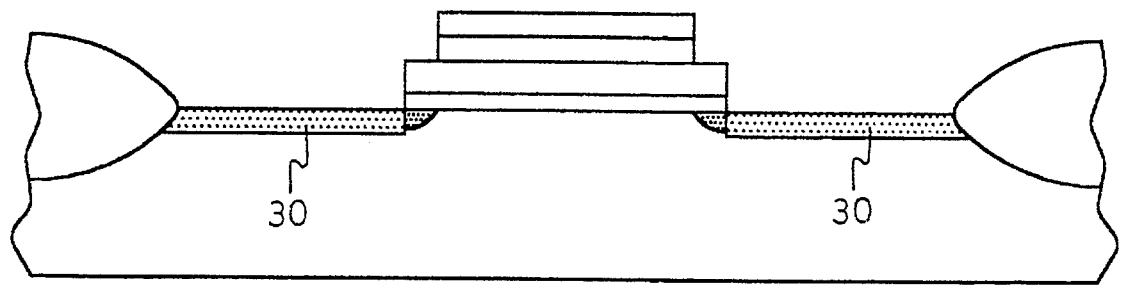

Referring to FIG. 7, the bottom layer 16 of the stacked-amorphous-silicon and the gate oxide layer 14 are etched using the spacers 28 and the silicon nitride layer 22 together as a mask. The etch is performed using, for example, dilute hydrofluoric (HF), which can etch both polysilicon and silicon dioxide. After the etching step, spacers 28 and silicon nitride layer 22 are then removed using, for example, a boiling phosphoric acid solution at 180° C.

Figure 8:
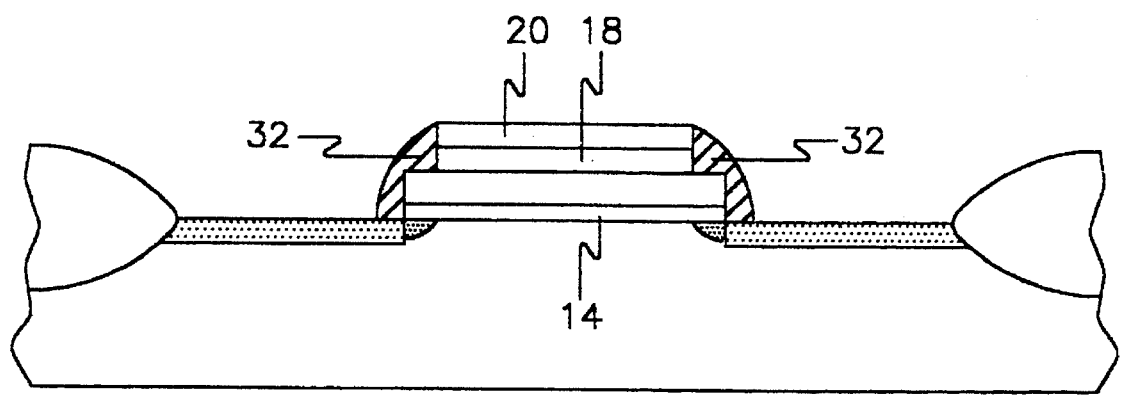

Furthermore, a silicon nitride layer 32 is chemically vapor deposited over the resultant structure of FIG. 7 and is then subject to etching back anisotropically so as to form spacers 32 on the sidewalls of the amorphous polysilicon layer 20, 18 and 16, and the gate oxide layer 14 as shown in FIG. 8. The length at the bottom of the spacers 32 is in the range of 0.25~0.30 micrometer.

Figure 9:
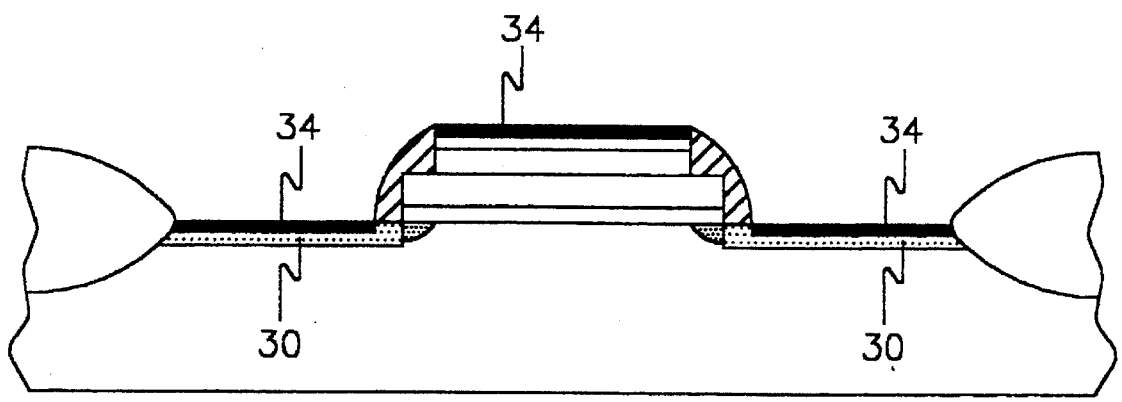

FIG. 9 shows the final step of the present invention which is to form self-aligned silicide (salicide) layers 34 over the $n^+$ heavily-doped regions 30 and the amorphous polysilicon layer 20. Being a case in point, $TiSi_2$ (titanium disilicide) is formed by reacting Ti with the silicon at temperature of about 600°~700° C. Afterward, the unreacted Ti is removed by a conventional wet etch process, thereby leaving silicide 34 on the gate, source and drain regions. The wet etch process mentioned above is achieved using a mixed solution of $H_3PO_4$ and $HNO_3$.

Accordingly, the feature of an inverse-T gate lightly-doped drain (ITLDD) structure with salicide is now accomplished. Combining LDD, inverse-T gate, stacked-amorphous-silicon and self-aligned silicide (salicide) technologies in the present invention, the channel hot carrier degradation can be improved due to the full drain-to-gate overlap. Further, the present invention is provided to ensure that the peak field location stays under the gate electrode because the $n^+$ regions are self-aligned aligned to the inverse-T gate.

Although specific embodiment has been illustrated and described, it will be obvious to those skilled in the art that various modifications may be made without departing from the spirit which is intended to be limited solely by the appended claims.

The embodiments of the invention in which an exclusive property or privilege is claimed are defined as follows:

1. A method for forming an inverse-T gate lightly-doped drain (ITLDD) device, said method comprising:

forming a gate oxide layer on a substrate;

forming stacked-amorphous-silicon layers on the gate oxide layer, said stacked-amorphous-silicon layers comprising at least two layers;

patterning a first dielectric layer on top of the stacked-amorphous-silicon layers by a photoresist mask;

forming lightly-doped source/drain regions using said photoresist mask;

removing portions of the stacked-amorphous-silicon layers until the bottom layer of said stacked-amorphous-silicon layers is exposed using said photoresist mask;

forming a second dielectric spacer on the sidewalls of the stacked-amorphous-silicon layers;

forming heavily-doped source/drain regions, said first dielectric layer and said second dielectric spacer serve as an implant mask;

removing the bottom layer of said stacked-amorphous-silicon layers, and the gate oxide layer using said implant mask;

removing the first dielectric layer and the second dielectric spacer;

forming a third dielectric spacer on the sidewalls of the stacked-amorphous-silicon layers and the gate oxide layer; and forming a silicide on top of the stacked-amorphous-silicon layers and on portions of the heavily-doped source/drain regions.

2. The method according to claim 1, wherein said first dielectric layer is a first silicon nitride layer.

3. The method according to claim 1, wherein said lightly-doped source/drain regions are formed using an ion-implant method.

4. The method according to claim 1, wherein the step of forming the second dielectric spacer comprises the steps of:

forming the second dielectric layer on the first dielectric layer and the bottom layer of the stacked-amorphous-silicon layers; and etching back said second dielectric layer anisotropically to form said second dielectric spacer.

5. The method according to claim 1, wherein said second dielectric spacer is a second silicon nitride spacer.

6. The method according to claim 5, wherein said second dielectric spacer is formed using a reactive ion etch method.

7. The method according to claim 1, wherein said heavily-doped source/drain regions are formed using an ion-implant method.

8. The method according to claim 1, further including the step of annealing the heavily-doped source/drain regions.

9. The method according to claim 8, wherein said heavily-doped source/drain regions are annealed using a furnace.

10. The method according to claim 8, wherein said heavily-doped source/drain regions are annealed using a rapid thermal process.

11. The method according to claim 1, wherein the step of forming the third dielectric spacer comprises the steps of:

forming the third dielectric layer on top of the stacked-amorphous-silicon layers, portions of the bottom layer of the stacked-amorphous-silicon layers, and portions of the heavily-doped source/drain regions; and etching back said third dielectric layer anisotropically to form said third dielectric spacer.

12. The method according to claim 1, wherein said third dielectric spacer is a third silicon nitride spacer.

13. The method according to claim 12, wherein said third dielectric spacer is formed using the reactive ion etch method.

14. The method according to claim 1, wherein the length at the bottom of said second dielectric spacer is in the range of 0.25~0.30 micrometer.

15. The method according to claim 1, wherein a phosphorus dopant is used to form said lightly-doped source/drain regions.

16. The method according to claim 1, wherein an arsenic dopant is used to formed said heavily-doped source/drain regions.

* * * * *